United States Patent [19]

Newland et al.

[11] 4,141,808

[45] Feb. 27, 1979

[54] MANGANESE CARBONYL-SULFONYL CHLORIDE PHOTOINITIATORS FOR RADIATION POLYMERIZABLE UNSATURATED COMPOUNDS

[75] Inventors: Gordon C. Newland; James G. Pacifici; David A. Young, all of Kingsport, Tenn.

[73] Assignee: Eastman Kodak Company, Rochester, N.Y.

[21] Appl. No.: 897,065

[22] Filed: Apr. 17, 1978

[51] Int. Cl.$^2$ .......................... C08F 2/46; C08F 4/00
[52] U.S. Cl. ........................ 204/159.24; 204/159.15; 204/159.18; 204/159.19; 96/115 P; 427/54
[58] Field of Search ................. 204/159.18, 159.24; 96/115 P

[56] References Cited

U.S. PATENT DOCUMENTS

| | | | |
|---|---|---|---|
| 3,702,812 | 11/1972 | McGinniss | 204/159.24 |
| 3,827,966 | 8/1974 | McGinniss | 204/159.24 |
| 3,966,573 | 6/1976 | Bean | 204/159.23 |
| 3,982,942 | 9/1976 | Lu | 96/35.1 |

*Primary Examiner*—Richard B. Turer
*Attorney, Agent, or Firm*—Donald W. Spurrell; Daniel B. Reece, III

[57] ABSTRACT

This invention relates to radiation curable compositions of radiation polymerizable unsaturated materials, and particularly concerns photoinitiators therefor comprising manganese carbonyl admixed with any of a variety of sulfonyl chloride compounds. The monomers initiated with these materials have high polymerization rates which permit faster curing cycles.

4 Claims, No Drawings

MANGANESE CARBONYL-SULFONYL CHLORIDE PHOTOINITIATORS FOR RADIATION POLYMERIZABLE UNSATURATED COMPOUNDS

This invention relates to radiation curable compositions of radiation polymerizable unsaturated materials, and particularly concerns photoinitiators therefor comprising manganese carbonyl admixed with any of a variety of sulfonyl chloride compounds. The monomers initiated with these materials have high polymerization rates which permit faster curing cycles.

The addition of photoinitiators to radiation polymerizable unsaturated monomers and oligomers to render them curable with radiation such as ultraviolet light is a low energy, rapid, nonpolluting method of coating substrates such as paper and metal can stock. Of particular need in the industry are unsaturated inks which can be dried very rapidly by irradiation with ultraviolet light. A limitation to the presently available systems is the web speed at which substrates can be coated and cured, and this is particularly critical in the case of high speed printing presses where the speed of photocuring is the limiting factor in production.

An objective of this invention is to provide improved performance photoinitiators for radiation curable coatings to give markedly higher cure rates.

This and other objects hereinafter appearing have been attained in accordance with the present invention through the discovery of a radiation curable composition comprising radiation polymerizable unsaturated material having admixed therewith curing components comprising from about 0.05 to about 5.0% by weight of manganese carbonyl based on total composition weight, and from about 0.05 to about 20.0% by weight based on total composition weight of a sulfonyl chloride compound of the formula $$R-SO_2Cl$$

wherein R is selected from straight or branched chain or cyclic alkyl of 1-20 carbons, aryl of 6-14 carbons, and aralkyl of 6-14 carbons in the aryl moiety and of 1-2 carbons in the alkyl moiety, and wherein R may be substituted with up to 5 groups selected from Cl, Br, F, alkoxy of 1-6 carbons, alkyl of 1-4 carbons, $NO_2$, CN, $-SO_2Cl$, $-SO_2F$ and $COOR^1$ wherein $R^1$ is selected from hydrogen and alkyl of 1-6 carbons. Preferred concentrations of the $Mn_2(CO)_{10}$ are from about 0.05 to about 1.0% by weight of the total monomer-photoinitiator system, and the sulfonyl chloride from about 0.05 to about 10.0%.

Typical useful sulfonyl halides include α-chlorotoluenesulfonyl chloride, p-trichloromethylbenzenesulfonyl chloride, p-chloromethylphenyl-(4-chlorosulfonyl)benzoate, 4-chlorosulfonyl benzophenone, methanesulfonyl chloride, ethanesulfonyl chloride, 1-propanesulfonyl chloride, 1-butanesulfonyl chloride, 1-hexanesulfonyl chloride, 1-hexadecanesulfonyl chloride, 2-chloroethanesulfonyl chloride, 3-chloropropanesulfonyl chloride, trichloromethanesulfonyl chloride, trifluoromethanesulfonyl chloride, cyclohexanesulfonyl chloride, cyclopentanesulfonyl chloride, 2-methoxyethylsulfonyl chloride, 2-cyanoethylsulfonyl chloride, benzenesulfonyl chloride, m-benzenedisulfonyl chloride, 1,3,5-benzenetrisulfonyl chloride, p-toluenesulfonyl chloride, 2,4-dimethylbenzenesulfonyl chloride, 2,5-dimethylbenzenesulfonyl chloride, 2,4,6-trimethylbenzenesulfonyl chloride, 4-chlorobenzenesulfonyl chloride, 2,5-dichlorobenzenesulfonyl chloride, 3,4-dichlorobenzenesulfonyl chloride, 2,4,5-trichlorobenzenesulfonyl chloride, 2,3,4-trichlorobenzenesulfonyl chloride, 4-bromobenzenesulfonyl chloride, 4-fluorobenzenesulfonyl chloride, pentafluorobenzenesulfonyl chloride, 2,4,6-triisopropylbenzenesulfonyl chloride, 4-methoxybenzenesulfonyl chloride, 4-chloro-3-nitrobenzenesulfonyl chloride, 2-nitrobenzenesulfonyl chloride, 3-nitrobenzenesulfonyl chloride, 4-nitrobenzenesulfonyl chloride, 5-chlorosulfonyl-o-anisic acid, 3-chlorosulfonyl benzoic acid, 4-chlorosulfonyl benzoic acid, methyl-(3-chlorosulfonyl)benzoate, methyl-(4-chlorosulfonyl)benzoate, 1-naphthalenesulfonyl chloride, 2-naphthalenesulfonyl chloride, α-toluenesulfonyl chloride, and 1-anthracenesulfonyl chloride.

The term "radiation polymerizable unsaturated material" as used herein includes ethylenically unsaturated compounds such as vinyl esters, vinyl aromatics, α,β-unsaturated compounds, and includes single compound and multiple compound compositions. For example, the curable compositions may comprise a single compound such as hydroxypropyl acrylate. For better properties, however, multiple curable components are preferred such as the hydroxypropyl acrylate, neopentyl glycol diacrylate and a reactive oligomer such as an acrylate capped urethane. Typical such compounds useful in this invention are lower alkyl and substituted alkyl esters of acrylic and methacrylic acid, including methyl methacrylate, ethyl methacrylate, 2-ethylhexyl methacrylate, isobutyl methacrylate, butyl acrylate, 2-hydroxypropyl acrylate, and 2-methoxyethyl acrylate. Polyacrylyl compounds useful in the invention can be represented by the general formula:

$$(CH_2=\overset{R}{\underset{|}{C}}-COO)_rG$$

wherein R is hydrogen or methyl; G is a polyvalent alkylene group of the formula $C_xH_{2x-y}$ in which x is 2 to 10 and y is 0 to 2 [e.g., (a) diavalent alkylene such as $C_xH_{2x}$ when y = 0, i.e., $-C_2H_4-$, neo-$C_5H_{10}$; and the like; (b) trivalent alkylene such as $C_xH_{2x-1}$ when y = 1, i.e., $$-CH_2-\underset{|}{CH}-CH_2-,\ CH_3CH_2\underset{|}{\overset{CH_2-}{\underset{CH_2-}{C}}}-CH_2-$$

and the like or (c) tetravalent alkylene such as $C_xH_{2x-2}$ when y = 2; e.g., $$-CH_2-\underset{|}{\overset{CH_2-}{\underset{CH_2-}{C}}}-CH_2-$$

and the like]; a divalent $-(C_nH_{2n}O)_mC_nH_{2n}-$ group in which n is 2 to 4 and m is 1 to 10 [e.g., oxyethylene, oxypropylene, poly(oxyethylene), poly(oxybutylene), $-CH_2C(CH_3)_2COOCH_2-$, $C(CH_3)_2CH_2-$, and the like]; and r is the valence of G and can be from 2 to 4. Allyl acrylates and methacrylates, diallyl phthalate, vinyl acetate, vinylidene halides, amides such as acrylamide, diacetone acrylamide, vinyl aromatics such as styrene, alkyl styrenes, halostyrenes, and divinylbenzene may also be used.

The above unsaturated compounds can be used alone or in admixture with other unsaturated compounds such as oligomers of unsaturated polyesters, polyurethanes, or substituted cellulose esters. The cellulose esters may be represented by the general structure:

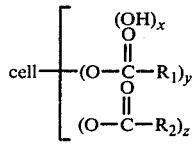

where cell- represents an anhydroglucose unit, $R_1$ is lower alkyl or aryl, $R_2$ is alkylene, arylene, or substituted arylene, X, Y, and Z represent the degree of substitution of the anhydroglucose unit and the sum of $X + Y + Z = 3$. Z can be from 0.01 to 2.0; however, the preferred range is 0.1 to 1.0.

Oligomers or low molecular weight polymers of saturated moieties may also be incorporated in the systems described above. For a more comprehensive discussion of curable compositions useful in the present invention, see the article by C. B. Rybny et al. in the *Journal of Paint Technology*, Vol. 46, No. 596, Sept. 1974, and the book by M. William Ranney, titled *Specialized Curing Methods for Coatings and Plastics*, Noyes Data Corp., Park Ridge, New Jersey, 1977, part 1, pp. 3–47. The photopolymerizable compositions may also contain other additives, pigments, colorants, stabilizers, and the like.

This invention will be further illustrated by the following examples although it will be understood that these examples are included merely for purpose of illustration and are not intended to limit the scope of the invention.

EXAMPLE 1

The photoinitiator systems were evaluated by a photocalorimetric technique. A Perkin-Elmer DSC-1B was modified by the installation of a quartz cover on the sample stage. Above this was installed a 200-watt mercury lamp with the light beam focused on the sample pan. A photographic shutter was interposed between the quartz cover and the mercury lamp. Thus, when a monomer containing a photoinitiator is placed in the sample pan and irradiated with a flash of light by operating the shutter, the exotherm of the polymerization is plotted on a recorder. Integration of the area under the exotherm gives the heat of polymerization in calories.

The technique used to evaluate the photoinitiator system was as follows: The photoinitiator was dissolved in 10 milligrams of the acrylic monomer, neopentyl glycol diacrylate (NPGDA), and the sample placed in the sample pan and allowed to stand for three minutes under the nitrogen atmosphere to flush out any occluded air. Polymerization was initiated by irradiating the sample with a fraction of a second flash and plotting the exotherm. This was continued until no exotherm was observed for the flash of light, at which time the sample was irradiated continuously and the final curing exotherm recorded. The plot of the exotherms produced a curing profile of the composition and each flash represented a fraction of the total polymerization. First order rate constants, i.e., the observed specific reaction-rate constant, may then be calculated by the following formula (Outlines of Physical Chemistry, Farrington Daniels, John Wiley and Sons, Incorporated, page 346):

$$k = \frac{2.303}{t} \log \frac{a}{a - x}$$

where t is time (seconds), a is the initial quantity of reacting material, and x is the amount reacting in time t. The various compositions evaluated by the above technique are listed in Table 1. The results show that a combination of manganese carbonyl and 1,2-dichlorobenzene-4,6-disulfonyl chloride has a rate constant of 7.1 which is much higher than either component alone and much higher than the 1.4 found for the commercial photoinitiator, α,α-diethoxyacetophenone. It is also evident that a wide variety of organometallic compounds are inoperable either alone or in combination with sulfonyl chloride compounds. The high rate obtained with the manganese carbonyl-sulfonyl chloride mixture was highly unexpected.

EXAMPLE 2

A series of sulfonyl chlorides and a control, benzoyl chloride, all 1.0% by weight of total composition weight, were tested in combination with 1.0% by weight manganese carbonyl in NPGDA wherein the irradiating source consisted of visible light (λ >400 nm). This was accomplished by interposing an ultraviolet absorbing filter in the photocalorimeter between the light source and the shutter. The absorption characteristics of the filter were such that it transmitted no light of wavelength shorter than 372 nm, 25% transmission at 380 nm, 66% transmission at 400 nm, and 100% above 410 nm. The compositions tested by the photocalorimetric technique of Example 1, modified to use visible light, are summarized in Table 2. The results show that the present manganese carbonyl-sulfonyl chloride photoinitiators are also effective in visible light and that other chlorinated compounds are ineffective.

EXAMPLE 3

The photoiniators to be evaluated were mixed with Hetron 520V (Ashland Chemical Company), an oligomer of isophthalic anhydride, maleic anhydride, and propylene glycol dissolved in α-methyl styrene and further diluted with 27% styrene. The compositions were irradiated in an inert atmosphere with a Gates 420U11B lamp and the tack-free cure times determined. The results, summarized in Table 3, show that materials containing a mixture of manganese carbonyl and 1,3,5-benzenetrisulfonyl chloride cured faster than the commercial isobutyl benzoin ether photoinitiator, Vicure 30. All percentages are by weight of total composition.

EXAMPLE 4

A pigmented composition consisting of:
15 parts Chempol 19-4827 (acrylate capped urethane oligomer)
12.5 parts NPGDA
15.0 parts Hydroxypropyl acrylate
7.5 parts 2-Ethylhexyl acrylate
30.0 parts $TiO_2$ (TiPure 33)
was mixed with 1% by weight manganese carbonyl and 1% by weight 1,3,5-benzenetrisulfonyl chloride by ball milling for two days. A curing profile was determined by the photocalorimetric technique described in Example 1. A specific reaction-rate constant (k) was determined as 1.1 (% sec$^{-1}$). This example illustrates the effectiveness of the present photoinitiator system in pigmented systems.

Table 1

Test Results of Organometallic Photoinitiators in NPGDA

| Component 1 | Concn. Wt. Percent | Component 2 | Concn. Wt. Percent | k |
|---|---|---|---|---|
| 1,2-Dichlorobenzene-4,6-disulfonyl chloride | 1 | None | — | 0.13 |
| None | — | Manganese carbonyl | 1 | 0.008 |
| 1,2-Dichlorobenzene-4,6-disulfonyl chloride | 1 | Manganese carbonyl | 1 | 7.1 |
| 1,2-Dichlorobenzene-4,6-disulfonyl chloride | 1 | Tungsten hexacarbonyl | 1 | 0.05 |
| 1,2-Dichlorobenzene-4,6-disulfonyl chloride | 1 | Mesitylene tungsten tricarbonyl | 1 | 0.007 |
| 1,2-Dichlorobenzene-4,6-disulfonyl chloride | 1 | Bis(triphenyl phosphine nickel carbonyl) | 1 | 0.14 |
| 1,2-Dichlorobenzene-4,6-disulfonyl chloride | 1 | $Ru(CO)_4P(C_6H_5)_3$ | 1 | 0.01 |
| 1,2-Dichlorobenzene-4,6-disulfonyl chloride | 1 | $[Co(CO_3)P(C_6H_5)_3]_2$ | 1 | 0.15 |
| 1,3,5-Benzenetrisulfonyl chloride | 0.5 | None | — | 0.04 |
| 1,3,5-Benzenetrisulfonyl chloride | 0.5 | $V(CO)_6$ | 0.5 | 0.04 |
| None | — | $V(CO)_6$ | 1.0 | 0.008 |
| 1,3,5-Benzenetrisulfonyl chloride | 1 | $Fe_2(CO)_9$ | 1 | 0.013 |
| None | | $Fe_2(CO)_9$ | 2 | 0.008 |
| None | | $Co_2(CO)_8$ | 2.5 | 0.009 |
| 1,3,5-Benzenetrisulfonyl chloride | 2.5 | None | — | 0.09 |
| 1,3,5-Benzenetrisulfonyl chloride | 1.25 | $Co_2(CO)_8$ | 1.25 | 0.02 |
| α,α-Diethoxyacetophenone | 1.0 | None | — | 1.4 |
| α-Toluenesulfonyl chloride | 0.49 | $Mn_2(CO)_{10}$ | 0.5 | 14.2 |
| p-Toluenesulfonyl chloride | 0.49 | $Mn_2(CO)_{10}$ | 0.5 | 12.9 |
| α-Toluenesulfonyl fluoride | 0.45 | $Mn_2(CO)_{10}$ | 0.5 | 0.6 |
| None | — | Manganese carbonyl bromide [$Mn(CO)_5Br$] | 0.31 | <0.006 |
| α-Toluenesulfonyl chloride | 0.25 | Manganese Carbonyl bromide [$Mn(CO)_5Br$] | 0.31 | 0.90 |
| Benzoyl chloride | 1.0 | $Mn_2(CO)_{10}$ | | 0.006 |
| 1-Butanesulfonyl chloride | 1.0 | $Mn_2(CO)_{10}$ | 1.0 | 3.7 |
| 1,3,5-Benzenetrisulfonyl chloride | 1.0 | $Mn_2(CO)_{10}$ | 1.0 | 8.3 |
| Trichloromethanesulfonyl chloride | 1.0 | $Mn_2(CO)_{10}$ | 1.0 | 4.6 |
| 2,4,6-Toluenetrisulfonyl chloride | 1.0 | $Mn_2(CO)_{10}$ | 1.0 | 8.8 |
| 2,4,6-Toluenetrisulfonyl chloride | 0.08 | $Mn_2(CO)_{10}$ | 5.0 | 9.7 |
| 2,4,6-Toluenetrisulfonyl chloride | 0.16 | $Mn_2(CO)_{10}$ | 5.0 | 13.0 |
| 2,4,6-Toluenetrisulfonyl chloride | 0.48 | $Mn_2(CO)_{10}$ | 5.0 | 9.2 |
| 2,4,6-Toluenetrisulfonyl chloride | 6.5 | $Mn_2(CO)_{10}$ | 5.0 | 5.7 |
| 2,4,6-Toluenetrisulfonyl chloride | 19.4 | $Mn_2(CO)_{10}$ | 5.0 | 3.7 |
| 1,2-Dichlorobenzene-3,5-disulfonyl chloride | 1.0 | $Mn_2(CO)_{10}$ | 1.0 | 7.8 |
| N-methyltetrachlorophthalamide | 1.0 | $Mn_2(CO)_{10}$ | 1.0 | 0.008 |

Table 2

Curing of NPGDA With Visible Light

| Chloride Component | k (Visible Light) |
|---|---|
| Benzoyl chloride | 0.006 |
| 1-Butanesulfonyl chloride | 1.32 |
| Benzene-1,3,5-trisulfonyl chloride | 4.70 |
| Trichloromethanesulfonyl chloride | 2.81 |
| Toluene-2,4,6-trisulfonyl chloride | 4.5 |
| 1,2-Dichlorobenzene-3,5-disulfonyl chloride | 4.3 |

Table 3

Curing of U.V. Curable Coatings Based on Polyesters

| Base Material | Photoinitiator | Tack-Free Cure Time, Minutes |
|---|---|---|
| Hetron 520V + 27% Styrene | 1% Vicure 30 | 1.5 |
| Hetron 520V + 27% Styrene | 1% $Mn_2(CO)_{10}$ 1% 1,3,5-Benzene-trisulfonyl chloride | 0.2 |

The invention has been described in detail with particular reference to certain preferred embodiments thereof, but it will be understood that variations and modifications can be effected within the spirit and scope of the invention.

We claim:

1. A photocurable composition comprising a photopolymerizable unsaturated material having admixed therewith, as a photoinitiator, from about 0.05 to about 5.0% by weight of manganese carbonyl based on total composition weight, and from about 0.05 to about 20.0% by weight based on total composition weight of a sulfonyl chloride compound of the formula R—SO$_2$Cl wherein R is selected from straight or branched chain or cyclic alkyl of 1–20 carbons, aryl of of 6–14 carbons, and aralkyl of 6–14 carbons in the aryl moiety and of 1-2 carbons in the alkyl moiety, and wherein R may be substituted with up to 5 groups selected from Cl, Br, F, alkoxy of 1-6 carbons, alkyl of 1-4 carbons, $NO_2$, CN, $-SO_2Cl$, $-SO_2F$, and $COOR^1$ wherein $R^1$ is selected from hydrogen and alkyl of 1-6 carbons.

2. The composition of claim 1 wherein R is aryl of 6-14 carbons which may be substituted with up to 5 groups selected from Cl, Br, F, alkoxy of 1-6 carbons, alkyl of 1-4 carbons, $NO_2$, CN, $-SO_2Cl$, $-SO_2F$, and $COOR^1$ wherein $R^1$ is selected from hydrogen and alkyl of 1-6 carbons.

3. The composition of claim 1 wherein R is aryl which may be substituted with up to 5 groups selected from alkyl of 1-4 carbons and $-SO_2Cl$.

4. The composition of claim 1 wherein the concentration of manganese carbonyl is from 0.05 to 1.0% by weight, and the sulfonyl chloride is from 0.05 to 10.0% by weight.

* * * * *